United States Patent
Goedeke et al.

[11] Patent Number: 5,034,748
[45] Date of Patent: Jul. 23, 1991

[54] NARROW BAND AUTOMATIC PHASE CONTROL TRACKING CIRCUITRY

[75] Inventors: Richard C. Goedeke, Lombard; Roger L. Peterson, Chicago, both of Ill.

[73] Assignee: The United States of America as represented by the Secretary of the Navy, Washington, D.C.

[21] Appl. No.: 419,151

[22] Filed: Dec. 3, 1973

[51] Int. Cl.$^5$ .............................................. G01S 7/35
[52] U.S. Cl. ..................................... 342/99; 342/103
[58] Field of Search ................... 343/7 A, 8; 342/99, 342/103

[56] References Cited

U.S. PATENT DOCUMENTS 3,295,127 12/1966 Kross ................................ 342/99 X
3,935,572 1/1976 Broniwitz et al. ................ 342/99 X
4,788,547 11/1988 Jones et al. ....................... 342/99 X Primary Examiner—T. H. Tubbesing
Attorney, Agent, or Firm—John Becker

[57] ABSTRACT

The invention disclosed herein relates in general to an improved circuitry for narrow band frequency tracking system for doppler radar and includes third order phase lock loop circuitry to improve tracking techniques. This enables tracking input frequency variations caused by target maneuvers with substantially smaller tracking bandwidths than is currently possible.

7 Claims, 2 Drawing Sheets

| PARMETER | 40 HZ LOOP BANDWIDTH | 20 HZ LOOP BANDWIDTH |
|---|---|---|
| $R_1$ | 71.6 K | 39. K |
| $R_2$ | 16 K | 6.2 K |
| C | 1 µf | 5.2 µf |

NARROW BAND AUTOMATIC PHASE CONTROL TRACKING CIRCUITRY

Various target paths and maneuvers require two basic capabilities of a doppler frequency tracking loop. (1) That an input rate discontinuity be followed equal to the maximum lateral target acceleration, and (2) that parabolic input frequency variations with a maximum coefficient of 60 kHz/sec$^2$ can be tracked. Both requirements represent a worst case situation, with a very low probability of occurrence. Each could be reduced somewhat, and still provide adequate tracking capabilities under most circumstances.

It is therefore an object of this invention to provide an improved tracking system for a doppler radar.

It is yet a further object of this invention to provide an improved narrow band automatic phase control tracking circuit comprising; an input phase detector, a local oscillator; a double integrator coupled to take the output of the phase detector and to feed an integrated signal to the local oscillator. The output of the local oscillator is coupled to the phase detector. Associated circuitry is required to illustrate the capabilities and applications of the tracking loop. These include a variable gain AGC amplifier; a second phase detector coupled to receive a signal from the local oscillator and to develop a feedback signal to control the AGC amplifier gain; and, means to detect AM signal information from the input signal.

Other objects, advantages and novel features of the invention will become apparent from the following detailed description of the invention when considered in conjunction with the accompanying drawings wherein.

Figure 2:
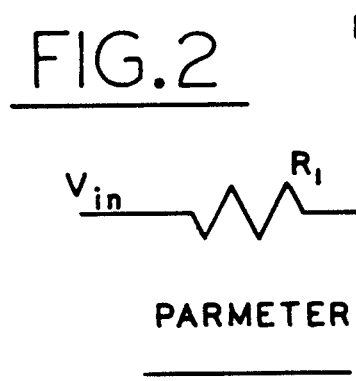
FIG. 2, is an integrator of FIG. 1.

A pair of phase detectors 10 and 20 are series-shunt choppers using two field effect transistors. Analysis of this type of circuit shows the useful direct current component of the output signal (the error signal) has an amplitude of $$e_o = \frac{\sqrt{2} A}{\pi} \sin \phi \text{ volts}$$

with "A" equal to the input rms signal level and $\phi$ equal to 90° plus with phase difference between the input and reference (LO) signals. Using a 50 mv input level and approximating $\sin \phi$ by $\phi$, the transfer function for the phase detectors should be 22.2 mv/radian. Measurements check this figure very well with a value of 22.45 mv/radian. Coupled to detector 10 is an integrator 11, which consists of an SN 524 A1 operational amplifier with appropriate input and feedback resistors and capacitors, as shown in FIG. 2. The transfer function of this type of circuit is $$\frac{V_{out}}{V_{in}} = A' \frac{s + \alpha_1}{s + \alpha_2} = -0.223 \frac{s + 62.5}{s + 0.014}$$

with $$A' = \frac{-AR_2}{R_1(1 + A) + R_2}$$

$$\alpha_1 = \frac{1}{R_1 C} \quad \alpha_2 = \frac{1}{R_1(1 + A) + R_2 C}$$

values given above are calculated from the parameter values indicated in FIG. 2 for a 40 Hz loop bandwidth.

Design relationships for the third order loop has been developed among these were $$K_o K_d \left[ \frac{\tau_2}{\tau_1} \right]^2 = \frac{2.5}{\tau_2}$$

and $$\omega_{3db} \tau_2 = 4.12$$

where $K_0$ and $K_d$ are the gains of the local oscillator and phase detector $\omega_{3db}$ is the APC loop $3_{db}$ bandwidth, and $\tau_1$ and $\tau_2$ are the integrator time constants $R_1 C$ and $R_2 C$. The values given in FIG. 2 satisfy the design relationships for a 40 Hz loop bandwidth.

An integrator short 12 consists of two field effect transistors connected to perform "OR" gate logic to short the first integrator input to output except when either pause lock or recycle bias is present. This prevents the first integrator from developing a charge during sweep intervals.

A loop switch 13 coupled to the output of integrator No. 1 11 is a field effect transistor and is driven by loop drive switch 40. The two stages act to open the APC loop except when tracking. This prevents any residual unbalance from the main phase detector 10 from being applied to the second integrator 41 and detuning the local oscillator 15.

A sweep generator 14 is provided which consists of a threshold comparator integrated circuit. The hysteresis of the comparator is utilized to generate a nonsymmetrical pulse waveform into the second integrator. The integrator output consists of ramp waveforms which reset the sweep generator. The final result is a sawtooth sweep waveform covering a 20 Hz range in frequency at a 2 Hz sec sweep rate. In one successful embodiment a conventional laboratory voltage controlled signal generator (Wavetek Model 111) was used for a local oscillator 15 and 90° phase shifter 42. The VCO input terminal has a gain of 20 Hz/volt. Two outputs, 16, 17 are available to provide in-phase and quadrature signals.

Two junction transistors are used as drivers 18, 19 to drive phase detectors 10 and 20 respectively. The reference waveform applied to each phase detector is a square wave, 15 volts peak to peak in amplitude. Connecting driver 18 to phase detector 10 closes the doppler tracking loop.

An associated acquisition circuit is developed by use of the two phase detector 10, 20 outputs. The output of each is applied to a low pass filter 21, 22 with a 350 Hz calculated bandwidth for acqusition purposes. The filters eliminate much of the input doppler frequency and its harmonic components, but retains the low frequency signals.

The filtered detected signals from filters 21, 22 are then each applied to fixed gain amplifier stages 23, 24 consisting of integrated circuits. The gain of these stages is 22.6 or approximately +27 db. The IC bandwidth extends into the megahertz. Consequently, the bandwidth at these points would be principally determined by the preceding low pass filter. The 3 db bandwidth of the main channel filter and amplifier was measured as 330 Hz, and that of the quadrature channel was 325 Hz.

Low pass RC filters 25,26 are used in each channel to shape the signal applied to the pause lock threshold detectors 27, 28. In order to obtain an acquisition sensitivity commensurate with the tracking sensitivity, the bandwidth at this point must be equal to the APC loop bandwidth. Parameter values have been chosen to produce a 40 Hz bandwidth. The technique dislosed herein has additional applications beyond improved sensitivity. It is the narrow bandwidth at this point restricts search and acquisition performance.

Each channel has individually a double-ended threshold detector 27, 28 respectively to indicate when the output signal exceeds a given level of either polarity. The threshold level is adjusted to produce approximately 60 pause locks per minute for a noise-only input signal. This sets the threshold at approximately 3 times the rms noise level into the detector. As a result, the probability of signal sweep acquisition is only 2.3% with a signal to noise of 0 db. As previously noted, other acquisition techniques would be required for a practical application. The threshold detectors 27, 28 are biased such that the output level is at 0 volts dc for input levels between ±1.4 v dc. Otherwise, the output level switches to 4.7 volts.

A pause lock pulse generator 29 which receives signals from detectors, 27, 28 is a monostable multivibrator with a 100 msec time constant. This established the pause lock interval at that value. For each positive going transition from either pause lock threshold detector, a pause lock pulse is formed. This is a positive pulse, 5 volts in amplitude.

A recycle filter 30 coupled to the output of the fixed gain amplifier 24 is a low pass RC filter with a bandwidth of 4.2 Hz. The filter bandwidth is as narrow as possible to eliminate noise, but must be wide enough to permit the recycle bias to build up within the pause lock interval.

The recycle threshold detector 31 taking a signal from filter 30 is a single ended IC comparator designed to switch output levels when the input recycle bias is above a given level. Hysteresis is built into this detector such that recycle bias must drop well below the locking level to cause recycle.

This produces a stable lock condition rather than erratic switching. The loop will remain locked after pause lock if recycle bias into the recycle threshold detector exceeds 3.6 times the quiescent rms noise level. This requires an 11 db S/N ratio in the recycle bandwidth, equivalent to 1 db S/N ratio in the pause lock or tracking bandwidths. Once acquired and locked with recycle bias, the system retains lock unless recycle bias falls below the quiescent noise level, corresponding to a 0 db S/N ratio in the recycle bandwidth. These levels are subject to change based upon experience gained in operating the tracking loop.

Another circuit associated with the basic APC loop is the AGC. An automatic gain control low pass filter 32 is also connected to the output of amplifier 24 and is a simple RC circuit with a bandwidth of 0.78 Hz and time constant of 0.2 sec. The output of 32 is coupled to an AGC amplifier 33 of a feedback path and consists of an IC amplifier and emitter follower to provide the necessary current drive to the AGC diodes 34. The gain is 17.7 and an offset voltage is included for proper control of the AGC diodes.

The input doppler signal and the accompanying video noise of the homing system is applied to the tracking loop via the AGC diodes, 34 amplifier and driver 43. The purpose of these stages is to maintain the signal level of the two phase detectors at approximately 50 mv rms over a wide range of input signal level: 3 to 150 rms. This dynamic range is realized by use of an AGC diode circuit. The output signal level varies between 47 and 53 mv as the input level covers the range given above. The AGC diode technique involves a large inherent signal attenuation. This is compensated by the two series CA 3004 IC amplifiers.

The closed-loop frequency characteristic of this AGC circuit has been calculated and agrees with measured results, yielding a 30 Hz lower cut-off frequency for the closed loop AGC response. This value was selected to conform with typical AGC responses in doppler tracking loops encountering target fading, scintillation, etc. The AGC and APC loop bandwidths are of the same order of magnitude and satisfactory operation has been obtained.

Figure 3:
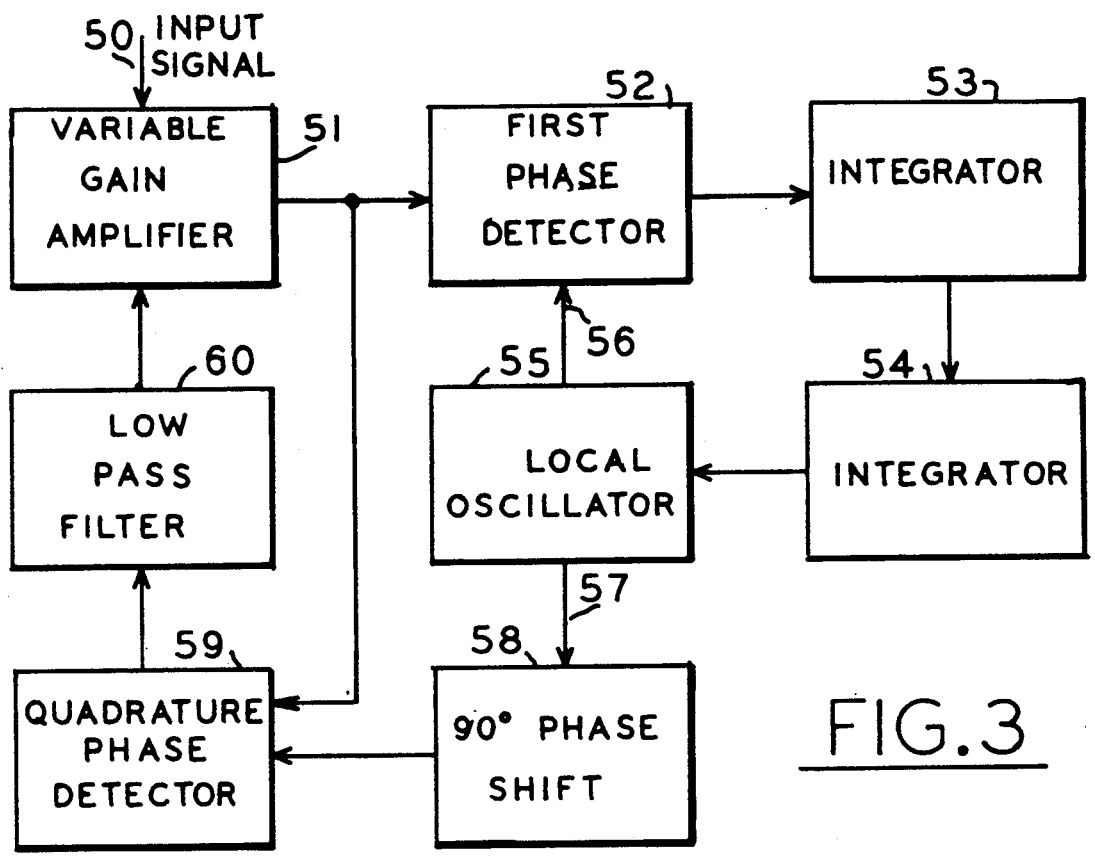
FIG. 3, is an overall block diagram of the system wherein many of the parts in FIG. 1 are combined.

FIG. 3 is a block diagram of the basic components of the circuit which have been set forth in detail above.

The items in FIGS. 1 and 2 have been consolidated for the sake of description of operation as follows.

An input signal entering on a line designated as 50 is fed to a variable gain amplifier 51. The signal is fed thru to a first phase detector 52 thru two integrator stages 53, 54 to a local oscillator 55. The oscillator 55 develops two outputs, one of which is fed to phase detector 52 via 56 and the other output via 57 to a 90° second phase shifter 58. A quadrature detector 59 receives the phase shifted signal from 59 and develops an output which is fed thru a low pass filter 60 to the variable gain amplifier 51. These stages and connections constitute the basic doppler frequency tracking phase lock loop.

When the basic loop is locked, the local oscillator 55 will be 90° out of phase with the input signal 50 in order to drive the phase error toward zero. A second phase detector 59 is used and is termed the quadrature detector. Its reference signal is the loop local oscillator, phase shifted 90° to be in phase with the input signal. The output of the quadrature phase detector is approximately a half wave rectification of the input signal, which is filtered, amplified, and eventually applied to a low pass filter. This produces a DC level, proportional to the input signal amplitude, which is amplified and used for AGC bias. AGC itself is accomplished by use of several integrated circuits in front of the basic APC loop. The gain of these circuits is dependent upon the DC voltage level applied to the control terminal. With AGC bias connected to this terminal the AGC loop is closed and the signal tracked by the APC loop is maintained at 50 mv rms at the input of the loop.

Figure 1:
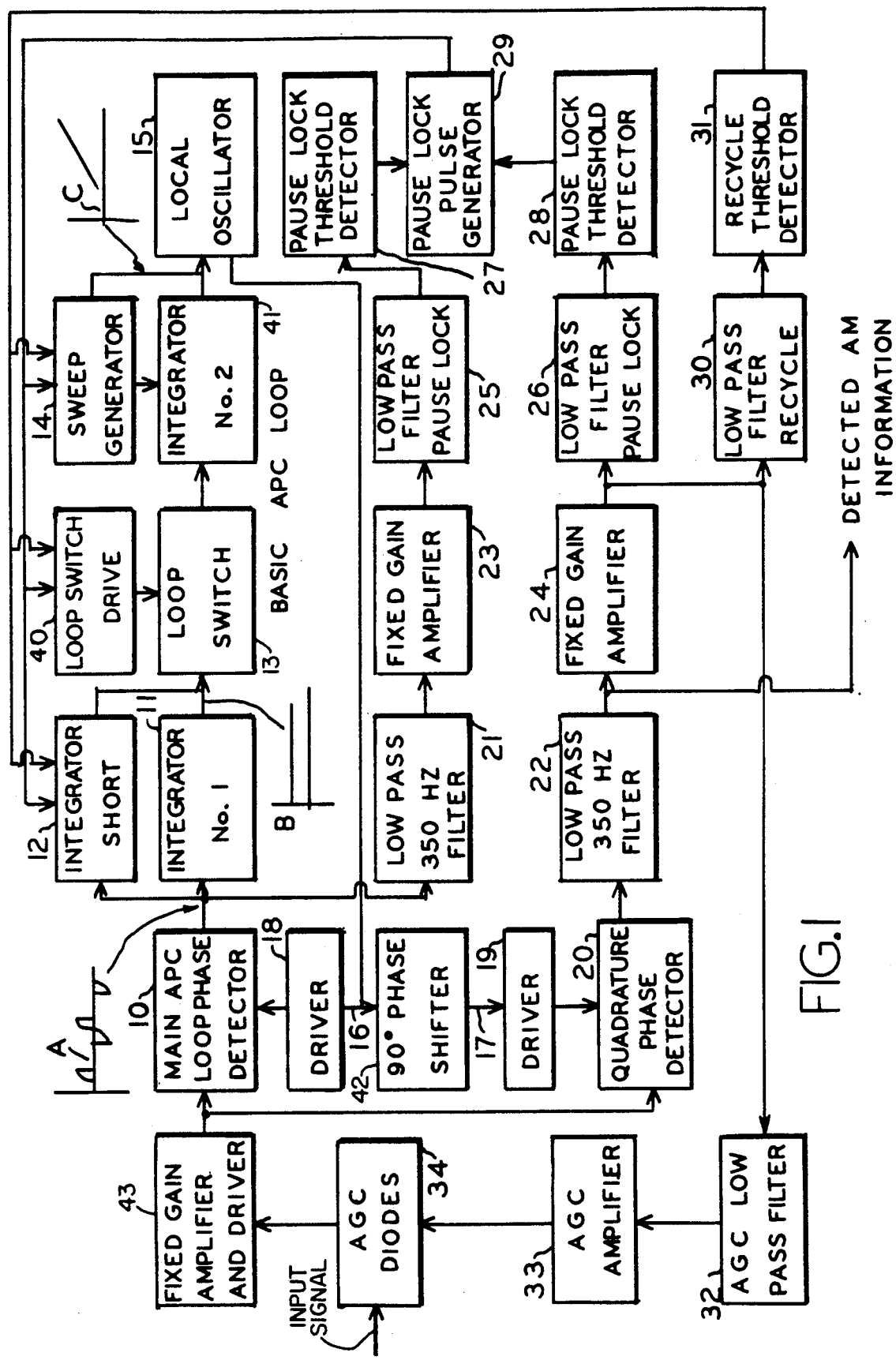
FIG. 1, shows a block diagram of one embodiment of an improved narrow band automatic phase control locked tracking system with associated with AGC acquisition circuitry and AM detector.

The general description of acquisition and recycle techniques is aided by reference to the block diagram of FIG. 3 and FIGS. 1 and 2. The search technique to be implemented is a conventional sweeping local oscillator. Either of two channels, operating in phase quadrature, are used to generate the pause lock pulse which stops the LO sweep. Another channel is used to develop recycle bias which holds the sweep off. Each of these functions is reviewed in the following paragraphs.

During the search mode of operation, the APC loop is opened by the loop switch drive 40 and loop switch 13. Opening the loop at this point is required to prevent local oscillator 15 drift due to small unbalances from the phase detector. The loop switch 13 is closed by a pause lock pulse, and when the loop is tracking, by the recycle bias which has been developed. Also during the search, the first integrator 11 of the loop filter is shorted to prevent a build-up of charge on the integrating capacitor. As with the loop switch, this short is eliminated during pause lock intervals and when a coherent target is sensed in the recycle channel. Thus, acquisition and tracking is performed by a true third order loop.

The LO sweep is accomplished by applying a low frequency pulse train voltage to the second integrator. This generates a sawtooth waveform to drive the LO and produces the desired sweep. By generating the sweep voltage with the second integrator, its capacitor is automatically charged to correspond to the LO frequency. When a pause lock occurs, no additional initial condition is required to set the integrator. The pause lock stops the LO sweep by disconnecting the sweep generator from the integrator input.

A pause lock of approximately 100 msec is developed when the input to the monostable multivibrator is triggered. This trigger signal is originally derived from one or both of the phase detectors, when the sweeping LO is at precisely the same frequency as the doppler input signal. This zero frequency beat between the input signals of a phase detector will produce an output DC component, approximately equal to $E_{max} \cos \theta$. Thus, the DC output is dependent in amplitude and polarity upon the instantaneous phase difference, $\theta$, between input signals. If the output signal in one channel is at a null, $\theta = 90°$, the other channel output is assured to be a maximum amplitude. By using the output of two quadrature channels, an indication of frequency coincidence is certain, independent of the instantaneous phase difference at the time of coincidence.

The two phase detector outputs are filtered, amplified, and applied to double ended threshold detectors 27, 28. Double ended detectors are required to handle the bipolar outputs of the phase detectors. Threshold detector outputs are summed and used to trigger the monostable multivibrator, which produces the pause lock pulse. As described above, the LO sweep is discontinued and the APC loop closed during the pause lock interval.

The recycle channel is used to keep the LO sweep off after the loop has pause locked to a true signal. Because of delays in producing the pause lock pulse and stopping the sweep, the LO and input doppler frequencies may no longer be identical. However, the difference should be well within the loop's pull in bandwidth, assuring nearly instantaneous acquisition. Once the APC loop is locked, the quadrature phase detector output signal is essentially a half wave rectification of the input doppler signal. This is low pass filtered in the recycle channel to develop recycle bias. As long as this bias persists, the loop remains closed and the LO sweep is eliminated. If a pause lock were caused by a noise spike, the quadrature phase detector output would consist of chopped noise. No recycle bias would be developed and the LO would resume sweeping.

The purpose of the narrow band tracking loop is to AM detect the input doppler signal. With the basic APC loop locked, the quadrature phase detector acts as an AM detector since its output level is dependent upon its input level. By filtering the chopped output signal, envelope variations or amplitude modulations on the input doppler signal are recovered. Thus the detected AM guidance information is available as indicated.

Curves labelled A, B, C, represent the voltage curves at these three points. These are the ramps of frequency change.

Obviously many modifications and variations of the present invention are possible in the light of the above teachings. It is therefore to be understood that within the scope of the appended claims the invention may be practiced otherwise than as specifically described.

We claim:

1. In a radar system an improved narrow band doppler frequency tracking system using a third order phase lock loop for improving acquisition and reporting of target angle comprising:
    (a) a variable gain amplifier coupled to receive input signals;
    (b) a first phase detector coupled to receive the output of said variable gain amplifier;
    (c) a local oscillator;
    (d) a double integrator circuit coupled to take the output of said first phase detector and to feed an integrated signal to said local oscillator, the output of said local oscillator being coupled to said first phase detector;
    (e) a second phase detector coupled to receive a signal from said local oscillator and a signal from said variable gain amplifier and to develop a feedback signal that is coupled to said variable gain amplifier; and,
    (f) means to determine audio modulation information from the input signal for deriving control information from said circuit to report target angle information and to direct the radar system to stay locked on target.

2. The improved narrow band automatic phase lock tracking circuitry of claim 1 wherein there is a fixed gain amplifier coupled between said variable gain amplifier and said first phase detector.

3. The improved narrow band automatic phase lock tracking circuitry of claim 2 wherein there is a 90° phase shifter coupled between said local oscillator and said variable gain amplifier.

4. The improved narrow band automatic phase lock tracking circuitry of claim 3 wherein said second phase detector is coupled between said 90° phase shifter and said variable gain amplifier.

5. The improved narrow band automatic phase control locked tracking circuitry of claim 4 wherein there is provided a low pass filter between said quadrature phase detector and said variable gain amplifier.

6. The improved narrow band automatic phase control locked tracking circuitry of claim 5 wherein a lock switch is coupled between said first and said second integrator.

7. The improved narrow band automatic phase control locked tracking circuitry of claim 6 wherein a lock drive circuit is coupled to control said lock switch and receive an input from a pause locked pulse generator.

* * * * *